United States Patent

Pitzer et al.

[15] 3,649,888

[45] Mar. 14, 1972

[54] DIELECTRIC STRUCTURE FOR SEMICONDUCTOR DEVICE

[72] Inventors: Dorman C. Pitzer, Palm Springs; Walter B. Braddock, Riviera Beach; Richard C. G. Swann; Anthony E. Pyne, both of North Palm Beach, all of Fla.

[73] Assignee: International Telephone and Telegraph Corporation, Nutley, N.J.

[22] Filed: May 14, 1969

[21] Appl. No.: 824,436

[52] U.S. Cl. ........................................317/235 R, 317/235 B

[51] Int. Cl. ........................................H01l 11/06, H01c 7/14

[58] Field of Search ..................................................317/235

[56] References Cited

UNITED STATES PATENTS

| | | | |
|---|---|---|---|
| 3,463,974 | 8/1969 | Kelley et al. | 317/235 |
| 3,465,209 | 9/1969 | Denning et al. | 317/235 |
| 3,475,234 | 10/1969 | Kerwin et al. | 317/235 |
| 3,479,234 | 11/1969 | Gray | 317/235 |
| 3,550,256 | 12/1970 | Deal | 317/235 |

OTHER PUBLICATIONS

IBM Tech. Discl. Bul., " Field Effect Transistor," by Baker et al., Vol. 11, No. 7, page 849 12/68

IBM Tech. Discl. Bul., " Masking Technique" by Dhaka et al., Vol. 11, No. 7, pages 864– 865 12/68

IBM Tech. Discl. Bul., " Forming Openings in an Insulating Layer" by Coates et al., Vol. 10, No. 3, Aug. 67 page 323

*Primary Examiner*—Jerry D. Craig

*Attorney*—C. Cornell Remsen, Jr., Walter J. Baum, Paul W. Hemminger, Percy P. Lantzy, Philip M. Bolton and Charles L. Johnson, Jr.

[57] ABSTRACT

This invention is for a dielectric structure for semiconductor devices which provides an oxygen barrier to preserve the high charge at a silicon-silicon oxide interface, and also serves as a barrier to mobile charges in a thin film of silicon oxide. The invention also provides for a structure and method of eliminating low-voltage dielectric breakdown at the border of the active and inactive regions in a semiconductor device.

8 Claims, 3 Drawing Figures

PATENTED MAR 14 1972 3,649,888

INVENTORS
DORMAN C. PITZER
WALTER B. BRADDOCK
BY RICHARD C. G. SWANN
ANTHONY E. PYNE

ATTORNEY

DIELECTRIC STRUCTURE FOR SEMICONDUCTOR DEVICE

BACKGROUND OF THE INVENTION

The advent of MOST's and high field devices has revealed some limitations in the use of silicon dioxide as a gate insulator or passivating medium. In particular, attention has been drawn to the inability of the oxide to stop fast diffusing alkali metals, e.g., sodium, potassium, or lithium. There occurs an oxygen diffusion through the silicon dioxide layer that would present a low-charge region when what is desired is a high-charge region. Silicon nitride has been considered to replace the silicon dioxide layer in the field or nonactive regions but this has disadvantages. It has been found that when silicon nitride is deposited directly on the substrate in a MOST there occurs a large number of gate to source shorts. An alternative solution is to deposit thin silicon nitride films over thermally oxidized device structures. The dense nitride apparently acts as a mask against subsequent contamination from impurity ions such as sodium. In addition, these nitride layers have been found to prevent or retard the annealing effects desired for obtaining low densities of fast surface states.

SUMMARY OF THE INVENTION

An object of the invention is to provide an improved dielectric layer for semiconductor devices.

Another object is to provide an improved dielectric layer over a semiconductor region which will have a very high threshold voltage to prevent inversion of the semiconductor surface.

It is still another object to provide an improved semiconductor device wherein the dielectric layer over the inactive region comprises three discrete layers of dielectric material.

According to a broad aspect of this invention there is provided a semiconductor device containing an active and inactive region, where the inactive region has a very high threshold voltage to prevent inversion of the semiconductor surface and the active region has a low number of surface states and a low threshold voltage. The active region may be a MOST device or a bipolar semiconductor device and the inactive region may contain conductor supply lines connecting elements of active regions.

A feature of this invention is that the dielectric layer over the inactive region is a sandwich comprising three distinct layers of dielectric material.

Another feature of this invention is that at the junction of the active and inactive regions the middle layer of the dielectric sandwich is etched away from the junction to allow the top dielectric layer to deposit directly on the bottom dielectric layer.

BRIEF DESCRIPTION OF THE DRAWINGS

Referring now to FIGS. 1 and 2 of the drawing, there is shown a substrate 1 of N-type conductivity silicon. P-type regions 2 and 3 are diffused into the substrate to form the drain and source regions respectively. Metal contacts 4 and 5, preferably aluminum, constitute the drain and source contacts. A three layer dielectric member 6 is disposed on the source and drain regions not covered by the metal contacts 4 and 5 and also over the inactive regions. The dielectric member 6 comprises a first layer 10 of silicon dioxide directly on the surface of the diffused regions; a second layer 11 of silicon nitride on the silicon dioxide 10 and a third layer 12 of thick silicon oxide on the silicon nitride layer 11. On the surface of the gate region, the original substrate, there is disposed a silicon dioxide layer 13 and on top of the oxide layer 13 is deposited a metal contact 14, for example, aluminum.

The expression for the threshold voltage of a MOST is:

$$V_t = \frac{-q(N_{ss} \pm N_B)t_0}{E_0 E_r} - \phi_{ms}$$

where $t_o$ = thickness of gate insulator
$q$ = electronic charge
$N_{ss}$ = number surfaces states
$N_B$ = bulk dopant concentration
$E_O$ = permittivity of free space
$E_r$ = the relative dielectric constant of insulator
$\phi_{ms}$ = metal/semiconductor work function difference The gate threshold voltage is usually low (around 2 to 6 volts) and is achieved by a combination of low $N_{ss}$ and a thin oxide (around 1,000 A.). The nonactive regions of the MOST (often referred to as the field insulator), however, demands a very high threshold voltage to avoid inversion of the silicon surface, under conductor supply lines, e.g., $V_{DD}$, $V_{GG}$, clock pulse and signal lines on a shift register integrated circuit.

It is common practice to simply use a thick insulator in these nonactive regions and disregard the $N_{ss}$ parameters. Unfortunately, the charge on thick oxides can migrate and modify the silicon/insulator interface such that $V_t$ can be reduced under operation conditions.

When the gate oxide is grown it uses up silicon so that there is a depression of the gate in the substrate surface.

We have primarily concerned ourselves with achieving a high charge interface and trapping this charge by the application of a layer of silicon nitride. The thickness of the insulator could be built up by the nitride, but an oxide is used to overcome the etching problem associated with silicon nitride.

Figure 1:
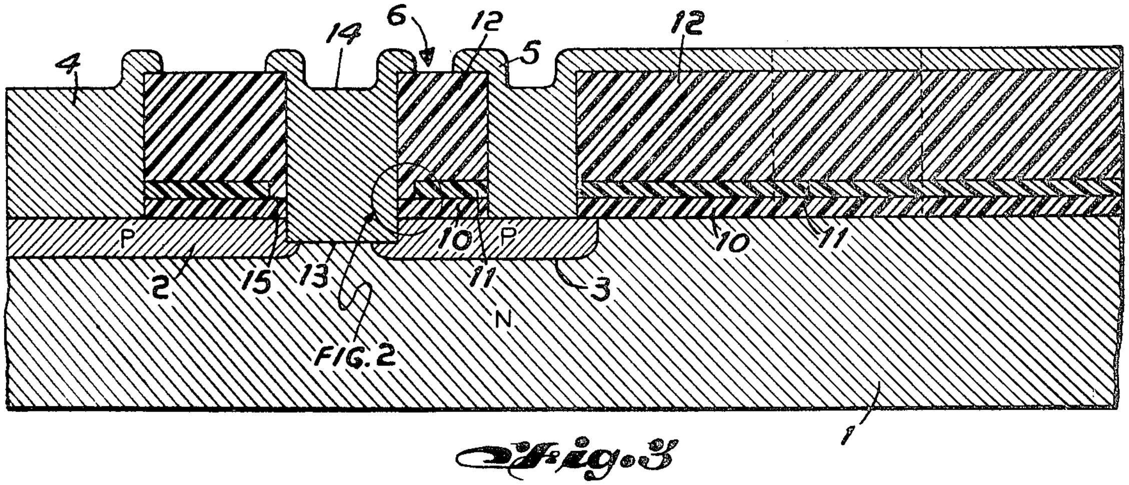
FIG. 1 is a cross section of a MOST device according to the invention.

It was found that when there was no cutting back of the silicon nitride as shown at 15 in FIG. 1 that numerous gate to drain shorts occurred. This was due to the fact that when the gate oxide was grown, no further oxidation took place under the silicon nitride so that there resulted a thinner layer of silicon dioxide separating the metallization 14 from the P region, or a dielectric weakness at that point. This dielectric weakness was eliminated by etching back the silicon nitride so that the oxide layer 12 directly contacts the first oxide layer 10. This is more fully shown in FIG. 2 which is a greatly expanded portion of FIG. 1 at the junction of the active and inactive region of the MOST, and illustrates more exactly the configuration of the different layers of dielectric. The cross section view of FIG. 1 may be regarded as a more idealized version of what actually is the structure.

Figure 2:
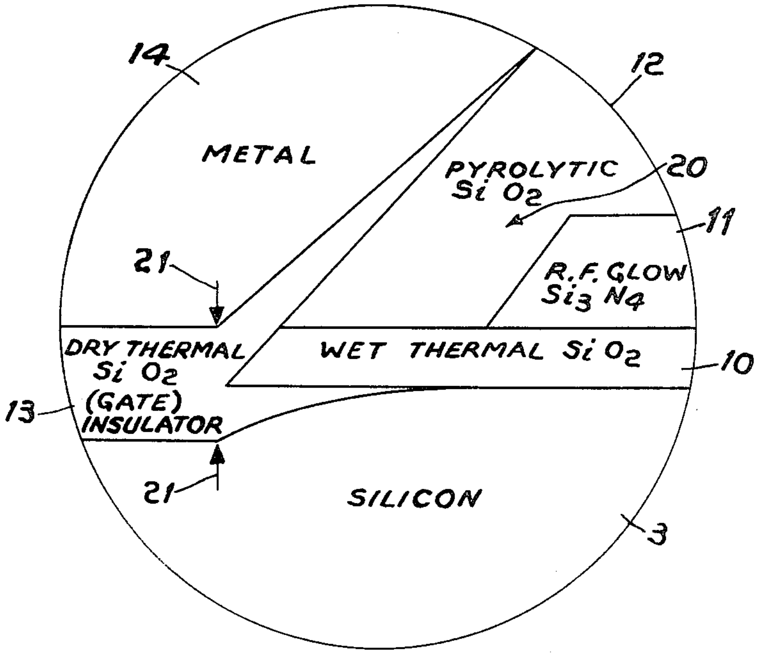
FIG. 2 is a greatly expanded view of a portion of the cross section of FIG. 1.

As shown in FIG. 2, the silicon nitride layer 11, which is originally coterminous with oxide layer 10 has been etched away, as shown at 20, so that when the oxide layer 12 is grown it extends down to and joins the oxide layer 10. The oxide layer 13, the gate oxide, is then grown on the gate region but extends over into the P regions underneath the oxide layer 10, and over the second oxide layer 12, so that there is a thicker oxide 13 layer in the region between the arrows 21, separating the metallization 14 and the P region 3.

Several samples of the dielectric sandwich MOST were made and tested.

EXAMPLE NO. 1

A dielectric sandwich was made on a silicon substrate comprising a first layer of 500 A. steam oxide, a second layer of 1,000 A. silicon nitride deposited by the RF glow discharge method and a third layer of 14,000 A. pyrolitically deposited silicon dioxide. It was found that there was no measured turn on less than 100 volts. $\Delta V_t$ was not measured.

EXAMPLE NO. 2

A dielectric sandwich was made on the silicon substrate as follows: a first layer of 1,000 A. steam oxide, a second layer of 1,000 A. silicon nitride and a third layer of 14,000 A. pyrolitic oxide. The turn on voltage was 40 volts and $\Delta V_t$ was 5–10 volts.

EXAMPLE NO. 3

A dielectric sandwich was made on a silicon substrate as follows: a first layer of 2,000 A. steam oxide, a second layer of silicon nitride of 1,000 A. and a third layer of 14,000 A.

pyrolitic oxide. The turn on voltage was 85 volts and $\Delta V_t$ was 10–15 volts.

EXAMPLE NO. 4

A dielectric sandwich was made on a silicon substrate as follows: a first layer of 2,000 A. steam oxide and a second layer of silicon nitride of 2,500 A. There was no pyrolitic oxide deposited. The turn on voltage was 50 volts.

EXAMPLE NO. 5

A dielectric sandwich was made on a silicon substrate as follows: a first layer of steam oxide of 500 A., a second layer of silicon nitride of 1,000 A. and a third layer of pyrolitic oxide of 12,000 A. The turn on voltage was 45 volts.

EXAMPLE NO. 6

A dielectric sandwich was made on a silicon substrate as follows: a first layer of 2,000 A. steam oxide and a second layer of silicon nitride of 3,000 A. There was no pyrolitic oxide deposited. The turn on voltage was 50 volts.

EXAMPLE NO. 7

A dielectric sandwich was made on the silicon substrate comprising a first layer of 14,000 A. pyrolitic oxide.

The optimum dielectric sandwich for the MOST was found to be the sandwich of Example No. 1.

The gate oxide was a dry thermal oxide made by oxidizing the silicon for 30 minutes in dry $O_2$ at 1,150° and annealing for 1 hour in dry $N_2$ at 1,150° C. The oxidation time will vary according to the desired depth of oxide. However, when growing a low charge interface, it is advisable to oxidize at a temperature of 1,150°-1,200° C.

The first layer of the dielectric sandwich 6, the steam oxide was made by oxidizing the silicon substrate in 920° C. steam atmosphere. The steam oxide produces a more disturbed interface with a higher charge. The higher interface charge is more suitable for the field insulator.

It is believed that this is because of the hydroxyl groups in the steam which are not present in the dry thermal oxide method.

The silicon nitride layer was produced by the RF glow discharge method as described in the copending application of Swann et al. for "Doping Semiconductors with Elemental Dopant Impurity," filed March 15, 1968, Ser. No. 713,412, and assigned to the assignee of this invention.

The pyrolitic oxide, the silicon dioxide layer on top of the silicon nitride was produced according to the method described in the copending application referred to above. The pyrolitic layer is a capacitive layer and is not required for stabilizing the interface. However, a poor pyrolitic layer may prove injurious to the device.

Figure 3:
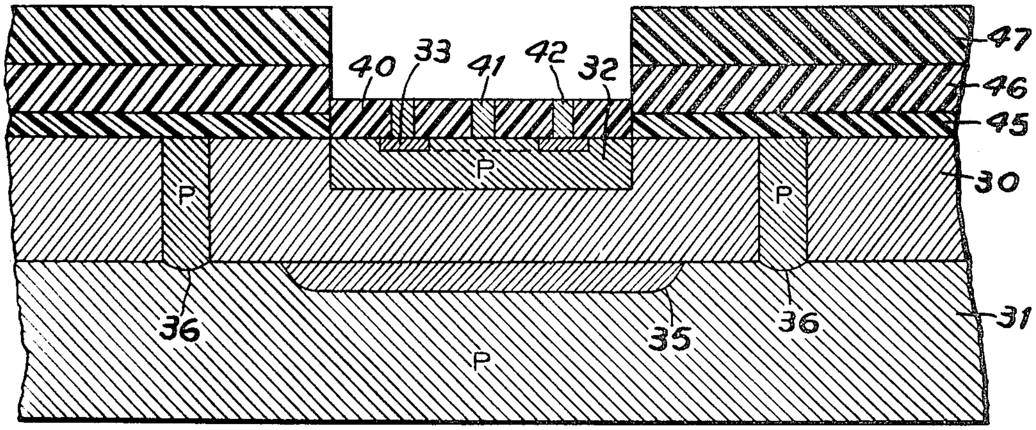
FIG. 3 is a cross section view of a bipolar semiconductor device according to the invention herein.

FIG. 3 illustrates a bipolar semiconductor device made in accordance with this invention. An epitaxial layer 30 of N-type conductivity is deposited on a silicon substrate 31 of P conductivity. A P conductivity region 32 is diffused into the epitaxial layer 30 for the base layer and emitter region 33 of N+ conductivity is diffused into the base layer 32. N+ region 35 has been prediffused into the substrate 31 and P regions 36 for isolation are diffused into the epitaxial layer 30 and substrate 31. The normal base and emitter oxide 40 is deposited on the base and emitter regions and metallic contacts 41 and 42 are deposited on the base and emitter regions respectively.

The optimum dielectric sandwich for the inactive regions of the bipolar device was found to comprise 500 A. steam oxide 45, 1,000 A. silicon nitride 46 and 8,000 A. pyrolitic oxide 47. For purposes of simplicity conductive supply lines connecting the base and emitter regions and extending over the inactive regions have been omitted.

The invention herein applies only to P channel enhancement mode devices. High positive charge is only required over N-type regions in both MOS and bipolar devices.

The invention eliminates the use of diffused or guard ring type structures to prevent inversion of the silicon surface. Guard ring structures require extra chip area and the resulting devices suffer from higher leakage currents.

The process is particularly applicable (but not restricted) to <100> oriented single crystal silicon because of its inherent lower number of surface states and hence lower threshold.

To further improve the stability of the pyrolitic oxide, it was subjected to a phosphorous ambient at 1,080° C. for 5–15 minutes. Then, the phosphorous was deglazed in 10 to 1 hydrofluoric acid solution. The device was then put through a 70 minutes anneal cycle at 1,150° C. in nitrogen. The device was then metallized and then subjected to a combined heat treatment and electrical stress treatment at 200° C. and an electrical field of $1\times10^6$ v./cm. for 16 hours. After the heat treatment and electrical stress treatment, the $V_t$ of the device changed less than 10 volts.

We claim:

1. A semiconductor device including a semiconductor material, said semiconductor material having active and nonactive regions, the semiconductor surface between active regions of a discrete component containing a low number of surface states and having a low threshold voltage, the semiconductor surface of said nonactive regions containing a high number of surface states and having a high threshold voltage wherein the improvement comprises:
   - a first layer of silicon dioxide overlying at least said nonactive regions of said semiconductor surface, said first silicon dioxide layer having a high charge at the interface of said semiconductor surface and said first silicon dioxide layer, said first silicon dioxide layer having a portion extending over a part of said active regions;
   - a layer of silicon nitride overlying said first silicon dioxide layer;
   - a second layer of silicon dioxide overlying a portion of said semiconductor surface between said active regions of said discrete component and abutting said portion of said first silicon dioxide layer, said second silicon dioxide layer underlies and is contiguous with said first silicon dioxide layer, said silicon nitride layer overlying said first silicon dioxide layer extends to a point before the abutting of said first and second silicon dioxide layers, said second silicon dioxide layer having a low charge at the interface between said semiconductor material and said second silicon dioxide layer;
   - a third layer of silicon dioxide disposed on and extending over an edge of said silicon nitride layer and contiguous with said first silicon dioxide layer; and a metal layer on said second layer of silicon dioxide.

2. A semiconductor device according to claim 1 wherein said active regions comprise diffused areas within said semiconductor material, said second silicon dioxide layer being disposed on the surface of said semiconductor material between said diffused areas of said discrete component, and metal contacts disposed on the surface of said diffused areas and second silicon dioxide layer.

3. A semiconductor device according to claim 1 wherein said first layer of silicon dioxide is produced by heating said dielectric material in a steam atmosphere.

4. A semiconductor device according to claim 1 wherein said first silicon dioxide layer has a thickness in the range 500 A. to 2,000 A., said silicon nitride layer has a thickness in the range of 1,000 A. to 3,000 A. and said third silicon dioxide layer has a thickness in the range of 8,000 A. to 14,000 A.

5. A semiconductor device according to claim 1 wherein said first silicon dioxide layer is 500 A., said silicon nitride layer is 1,000 A. and said third silicon dioxide layer is 14,000 A. thick.

6. A semiconductor device according to claim 1 wherein said first dioxide layer has a thickness in the range 500 A. to 2,000 A. and said silicon nitride layer has a thickness in the range of 1,000 A. to 3,000 A.

7. A semiconductor device according to claim 1 wherein said third layer of silicon dioxide is subjected to a phosphorous diffusion.

8. A semiconductor device according to claim 1 wherein said semiconductor material is <100> oriented single crystal silicon.

* * * * *